(12) United States Patent
Subramanian et al.

(10) Patent No.: US 6,580,298 B1
(45) Date of Patent: Jun. 17, 2003

(54) THREE INPUT SENSE AMPLIFIER AND METHOD OF OPERATION

(75) Inventors: Chitra K. Subramanian, Austin, TX (US); Bradley J. Garni, Austin, TX (US); Joseph J. Nahas, Austin, TX (US); Thomas W. Andre, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/186,363

(22) Filed: Jun. 28, 2002

(51) Int. Cl.[7] .................................................. G11C 7/06
(52) U.S. Cl. ............................ 327/55; 327/74; 327/52
(58) Field of Search ............................. 327/51–57, 77, 327/74

(56) References Cited

U.S. PATENT DOCUMENTS

| | | | |
|---|---|---|---|
| 4,713,797 A | | 12/1987 | Morton et al. |
| 5,391,938 A | * | 2/1995 | Hatsuda ..................... 326/54 |
| 5,485,292 A | * | 1/1996 | Wong et al. ................. 327/56 |
| 5,488,322 A | * | 1/1996 | Kaplinsky .................... 327/74 |
| 6,154,065 A | * | 11/2000 | Komatsu ..................... 327/56 |
| 6,191,989 B1 | | 2/2001 | Luk et al. |
| 6,269,040 B1 | | 7/2001 | Reohr et al. |
| 6,407,588 B1 | * | 6/2002 | Baker ......................... 327/55 |

* cited by examiner

Primary Examiner—Toan Tran
(74) Attorney, Agent, or Firm—Robert L. King; James L. Clingan, Jr.

(57) ABSTRACT

A sense amplifier having three inputs determines the state of a memory bit cell by converting a bit input voltage, a high reference voltage, and a low reference voltage to respective current values. Current differences are formed between a bit current and a high reference current, and between a low reference current and a bit current. Current mirrors (154, 158 and 170, 166) and loads (160 and 168) are used in conjunction with current steering circuitry (150, 140, 142 and 162) to form the difference of the bit current and the high reference current and also form the difference of the low reference current and the bit current. Additionally, the sense amplifier drives differential outputs (OUT and $OUT_{13}B$) to reflect the difference between the two current differential quantities.

13 Claims, 7 Drawing Sheets

THREE INPUT SENSE AMPLIFIER AND METHOD OF OPERATION

RELATED APPLICATION

This application is related to:

U.S. patent application Ser. No. 10/184,720, entitled "Balanced Load Memory And Method of Operation" by Subramanian et al. filed simultaneously herewith, and assigned to the assignee hereof.

FIELD OF THE INVENTION

This invention relates generally to semiconductor circuits, and more specifically, to semiconductor memory circuits.

BACKGROUND OF THE INVENTION

Non-volatile memory devices, such as FLASH memories, are extremely important components in electronic systems. FLASH is a major non-volatile memory device in use today. Disadvantages of FLASH memory include high voltage requirements and slow program and erase times. Also, FLASH memory has a poor write endurance of $10^4$–$10^6$ cycles before memory failure. In addition, to maintain reasonable data retention, the scaling of the gate oxide is restricted by the tunneling barrier seen by the electrons. Hence, FLASH memory is limited in the dimensions to which it can be scaled.

To overcome these shortcomings, other types of nonvolatile memories are being evaluated. One such device is magnetoresistive RAM (hereinafter referred to as "MRAM"). To be commercially practical, however, MRAM must have comparable memory density to current memory technologies, be scalable for future generations, operate at low voltages, have low power consumption, and have competitive read/write speeds.

The resistance of the tunnel junction (TJ) changes value depending on the state of polarization of the magnetic layers above and below the tunnel junction. The resistance changes from a lower resistance value when the magnetic fields are aligned in the same direction to a higher resistance value when they are aligned in opposite directions. The value change may be on the order of thirty percent. Therefore, for a low resistance value of 10K ohms, the high resistance value could be about 13K ohms. A sense amplifier for an MRAM needs to detect this difference in value. Since the nominal value of the resistance has variation due to processing, it is useful to detect the state of a bit by comparing the resistance of the TJ in a bit to a nearby midpoint reference that may be formed as a midpoint of a reference bit in the high state and a reference bit in the low state. It is also important to maintain symmetry to balance the loading from the parasitic resistance and capacitance of the bit lines and the column multiplexing. In U.S. Pat. No. 6,269,040 entitled "Interconnection network for connecting memory cells to Sense Amplifiers" by Reohr et al., a resistance of a cell is compared to that of an average resistance between a high and a low reference. In the Reohr et al. circuit, the loading is almost but not fully balanced by sharing reference from two different subarrays to form the midpoint reference. Unfortunately, this solution also requires two sense amplifiers to implement. In addition, for memory arrays that require significant current to charge the bit line capacitance relative to the steady state current signals, such as in an MRAM, a significant percentage of the sensing time may be consumed for bit line charging and equalization.

Most known sense amplifiers have output terminals that are very responsive to movement on the input nodes of the sense amplifier. This responsiveness causes swings on the output nodes as the input nodes are charged to their steady state levels. During swings in voltage, capacitive imbalance may dominate the transient signal, resulting in loss of differential signal and speed of operation.

MRAMs offer the promise of a universal memory that can be high speed and non-volatile. Realizing this promise requires further improvements in speed and memory area efficiency, especially in the sensing speed of stored data values.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
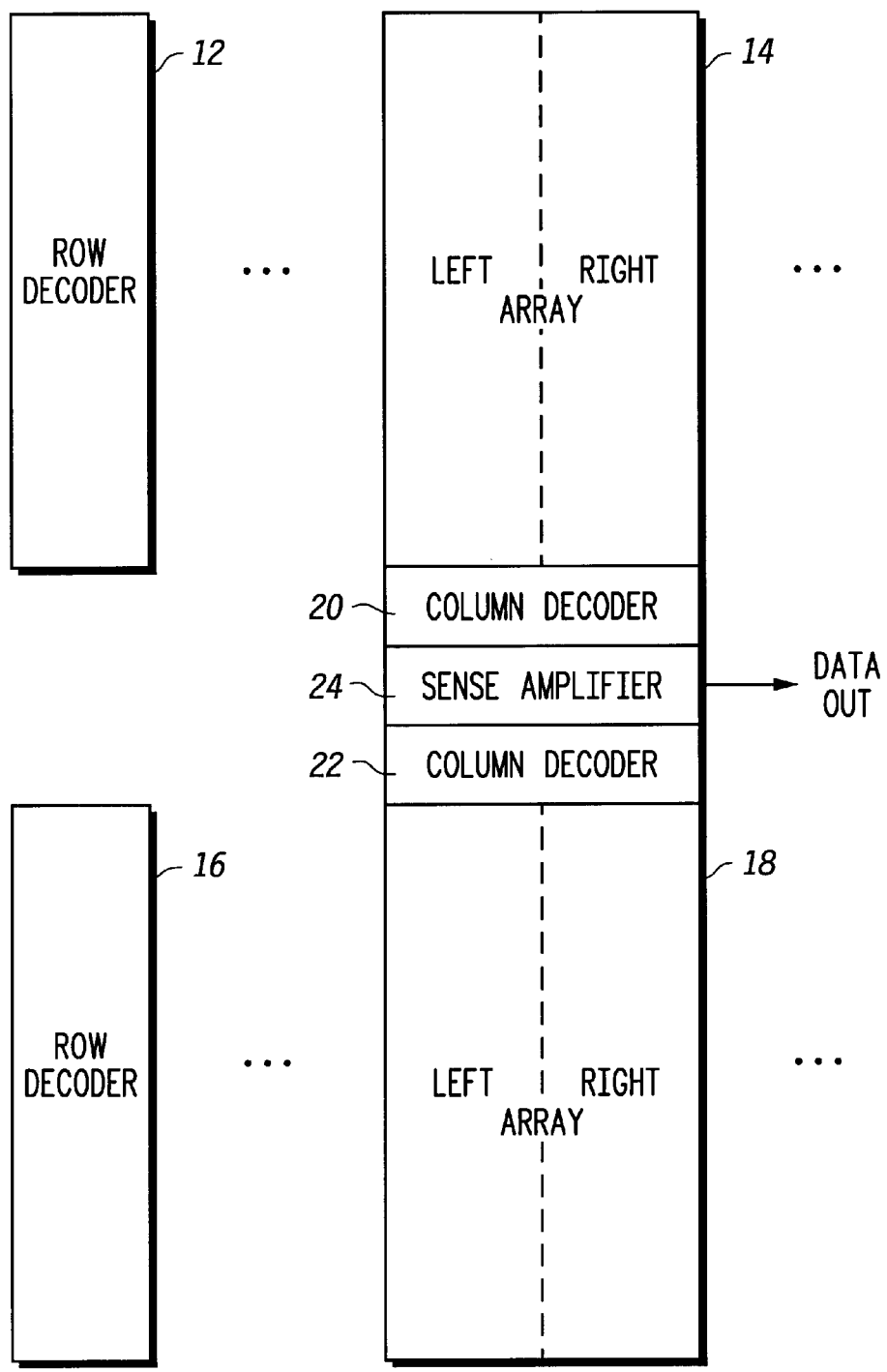
FIG. 1 illustrates in block diagram form a memory array architecture.

FIG. 1 illustrates a memory array architecture 10 that may benefit from a sense amplifier having a balanced load structure. Memory array architecture 10 has a row decoder 12 for selecting rows associated with a first sub-array or a sub-array 14 in response to decoding memory addresses. The sub-array 14 has a first portion or a left portion and a second portion or a right portion. A row decoder 16 decodes the memory address to select rows associated with a second sub-array or sub-array 18 that also has a left portion and a right portion. Memory array architecture may also be considered to have a first sub-array, a second sub-array, a third sub-array and a fourth sub-array from the left and right portions of sub-arrays 14 and 18. A column decoder 20 is connected to the sub-array 14 for decoding the memory addresses and accessing bit data from a predetermined column within the sub-array 14 if any memory address matches a column address within sub-array 14. A column decoder 22 is connected to the sub-array 18 for decoding the memory addresses and accessing bit data from a predetermined column within the sub-array 18 if any memory address matches a column address within sub-array 18. A sense amplifier 24 is connected to each of column decoder 20 and column decoder 22. Sense amplifier 24 determines a data value as being either a one or a zero at a memory bit location corresponding to an intersecting selected row and column within either sub-array 14 or sub-array 18. Sense amplifier 24 has an output terminal for providing the Data Out value for the bit being addressed within memory array architecture 10. The decode and sensing functionality described herein is repeated in modular fashion for each data bit of the output.

Figure 2:
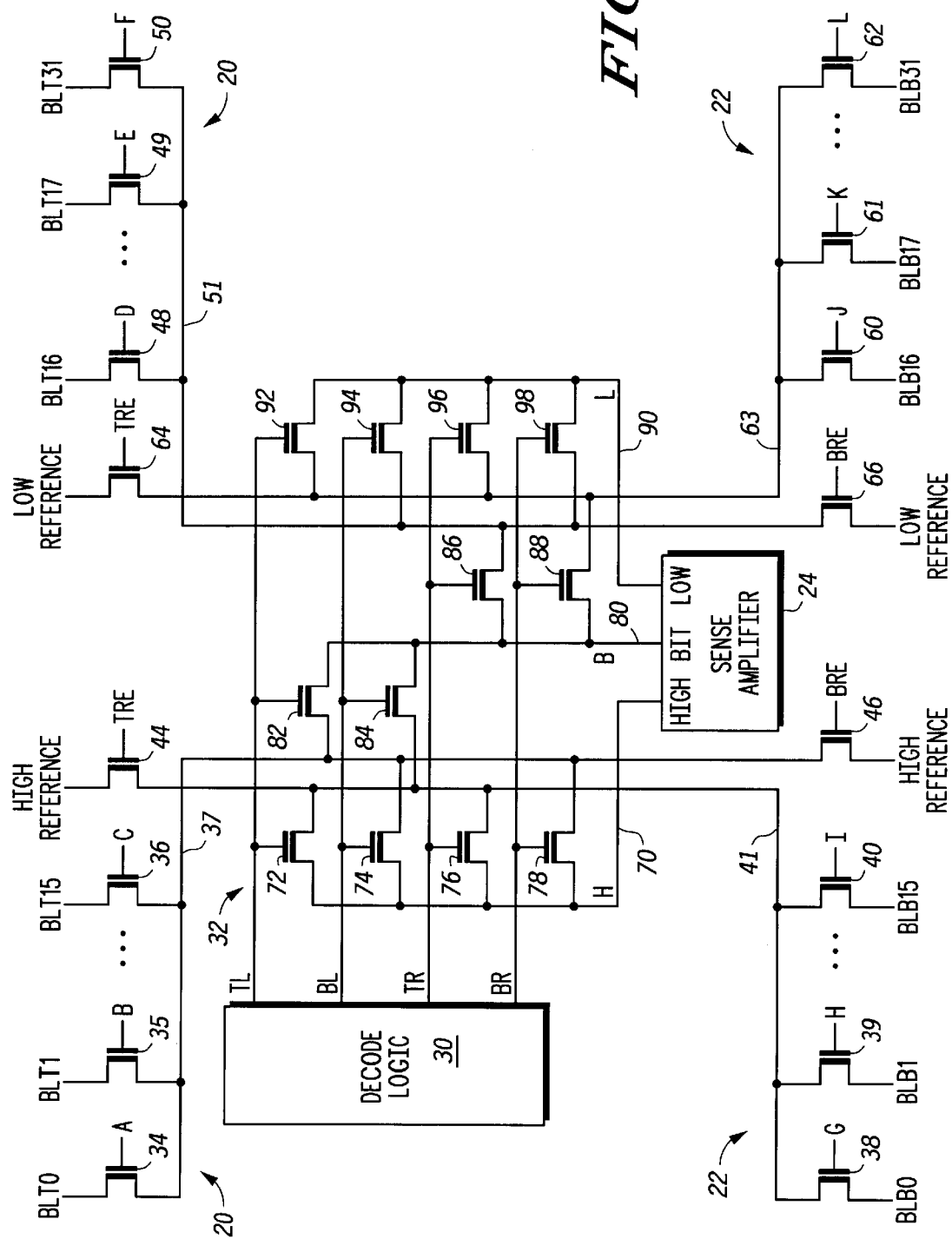
FIG. 2 illustrates in partial schematic diagram form a balanced load memory interconnect scheme.

Illustrated in FIG. 2 is a further detail of the interconnect structure within column decoder 20, column decoder 22 and sense amplifier 24 of FIG. 1 in conjunction with additional circuitry that balances the loading of the memory structure. The memory interconnect structure has a top portion of bit lines that are labeled with a "T" designator from T0 to, for example, T31, and a bottom portion of bit lines that are labeled with a "B" designator, such as from B0 to B31, that are interfaced by a multiplexer in the form of a multiplexing switch module 32. Column decoder 20 has an N-channel transistor 34 having a source connected to a bit line (BL) conductor BLT0, a control electrode or gate connected to a control signal A, and a drain connected to a first data line or a conductor 37. An N-channel transistor 35 has a source connected to a bit line conductor BLT1, a gate connected to a control signal B, and a drain connected to conductor 37. An N-channel transistor 36 has a source connected to a bit line conductor BLT15, a gate connected to a control signal C, and a drain connected to conductor 37. A predetermined number of intervening transistors with analogous connections are provided between transistors 35 and 36 as indicated by the dotted line. The number of intervening transistors depends upon the particular implementation so that the total number of bit line transistors in the left portion of the column decoder 20 (TL) is usually eight, sixteen, thirty-two, sixty-four or some other power of two. To achieve a balanced interconnect scheme, the total number of bit line transistors in the left portion of column decoder 20 should match the total number of bit line transistors in the top right of column decoder 20 (TR), as well as the total number in the left and right portions of column decoder 22 (BL and BR, respectively). A left portion of the column decoder 22 (BL) generally has a plurality of transistors, such as a transistor 38, a transistor 39 and a transistor 40 and other intervening transistors (not shown). An N-channel transistor 38 has a source connected to a bit line labeled BLB0, a gate connected to a control signal labeled G, and a drain connected to a conductor 41 that is a first data line of column decoder 22. An N-channel transistor 39 has a source connected to a bit line labeled BLB1, a gate connected to a control signal labeled H, and a drain connected to conductor 41. An N-channel transistor 40 has a source connected to a bit line labeled BLB15, a gate connected to a control signal labeled I, and a drain connected to conductor 41. A predetermined number of intervening transistors (matching the number between transistors 35 and 36) with analogous connections are provided between transistors 39 and 40 as indicated by the dotted line. An N-channel transistor 44 has a source connected to a reference voltage terminal for receiving a first "High Reference" voltage, a first reference type, via a first reference line in the first (left) portion of the first sub-array 14. A gate of transistor 44 is connected to a control signal labeled "TRE" meaning "Top Reference Enable". Transistor 44 has a drain connected to conductor 41. A drain of an N-channel transistor 46 is connected to conductor 37. A gate of transistor 46 is connected to a control signal labeled "BRE" meaning "Bottom Reference Enable", and a source of transistor 46 is connected to a reference voltage terminal for receiving a second "High Reference" voltage, also of the first reference type, via a second reference line in the first (left) portion of the second sub-array 18. An N-channel transistor 48 has a source connected to a bit line labeled BLT16, a gate connected to a control signal labeled D, and a drain connected to a second data line or a conductor 51. An N-channel transistor 49 has a source connected to a bit line labeled BLT17, a gate connected to a control signal labeled E, and a drain connected to conductor 51. An N-channel transistor 50 has a source connected to a bit line labeled BLB31, a gate connected to a control signal labeled F, and a drain connected to conductor 51. A predetermined number of intervening transistors (matching the number between transistors 35 and 36) with analogous connections are provided between transistors 48 and 49 as indicated by the dotted line. An N-channel transistor 64 has a source connected to a reference voltage terminal for receiving a first "Low Reference" voltage, a second reference type, via a third reference line in the second (right) portion of the first sub-array 14. A gate of transistor 64 is connected to a control signal labeled "TRE" meaning "Top Reference Enable". Transistor 64 has a drain connected to a conductor 63 that is a second data line of column decoder 22. Therefore, conductors 37, 41, 51 and 63 respectively form a first data line, a second data line, a third data line and a fourth data line. A drain of an N-channel transistor 66 is connected to conductor 51. A gate of transistor 66 is connected to a control signal labeled "BRE" meaning "Bottom Reference Enable", and a source of transistor 66 is connected to a reference voltage terminal for receiving a second "Low Reference" voltage, also of the second reference type, via a fourth reference line in the second (right) portion of the second sub-array 18. An N-channel transistor 60 has a source connected to a bit line labeled BLB16, a gate connected to a control signal labeled J, and a drain connected to the conductor 63. An N-channel transistor 61 has a source connected to a bit line labeled BLB17, a gate connected to a control signal labeled K, and a drain connected to conductor 63. An N-channel transistor 62 has a source connected to a bit line labeled BLB31, a gate connected to a control signal labeled L, and a drain connected to conductor 63. A predetermined number of intervening transistors (matching the number between transistors 35 and 36) with analogous connections are provided between transistors 61 and 62 as indicated by the dotted line.

Multiplexing switch module 32 generally has balanced groups of N-channel transistors 72, 74, 76, 78, N-channel transistors 82, 84, N-channel transistors 86, 88 and N-channel transistors 92, 94, 96, 98. Transistor 72 has a gate connected to a top left (TL) decoded output of decode logic 30, a source connected to conductor 41, and a drain connected to a first or High (H) reference output 70 that is connected to a first input, a High reference input, of sense amplifier 24. Transistor 74 has a gate connected to a bottom left (BL) decoded output of decode logic 30, a source connected to conductor 37, and a drain connected to the High reference output 70. Transistor 76 has a gate connected to a top right (TR) decoded output of decode logic 30, a source connected to conductor 41, and a drain connected to the High reference output 70. Transistor 78 has a gate connected to a bottom right (BR) decoded output of decode logic 30, a source connected to conductor 37, and a drain connected to the High reference output 70. Transistor 82 has a gate connected to the top left decoded output of decode logic 30, a source connected to conductor 37, and a drain connected to a bit (B) data output 80. The bit data output 80 is connected to a second input, a Bit data input, of sense amplifier 24. Transistor 84 has a gate connected to the bottom left decoded output of decode logic 30, a source connected to conductor 41, and a drain connected to the bit data output 80. Transistor 86 has a gate connected to the top right decoded output of decode logic 30, a source connected to conductor 51, and a drain connected to the bit data output 80. Transistor 88 has a gate connected to the bottom right decoded output of decode logic 30, a source connected to conductor 63, and a drain connected to the bit data output 80. Transistor 92 has a gate connected to the top left decoded output of decode logic 30, a source connected to conductor 63, and a drain connected to a second or a low (L) reference output 90. The low reference output 90 is connected to a third input, a Low reference input of sense amplifier 24. Transistor 94 has a gate connected to the bottom left decoded output of decode logic 30, a source connected to conductor 51, and a drain connected to the low reference output 90. Transistor 96 has a gate connected to the top right decoded output of decode logic 30, a source connected to conductor 63, and a drain connected to the low reference output 90. Transistor 98 has a gate connected to the bottom right output of decode logic 30, a source connected to conductor 51, and a drain connected to the low reference output 90.

In operation, each of the bit lines BLT0–BLT15, BLT16–BLT31, BLB0–BLB15 and BLB16–BLB31 is connected to a predetermined memory sub-array column (not shown). Each of the memory sub-array columns relates either to a top memory sub-array or a bottom memory sub-array. Further, the top memory sub-array has two portions, a left top portion and a right top portion. Similarly, the bottom memory sub-array has two portions, a left bottom portion and a right bottom portion. Bit lines within each portion share a common sensing rail, such as conductor 37 of the left top portion, onto which individual bit lines are connected through pass-gate switches such as transistor 35 or transistor 36. The bit lines in the top left portion and the top right portion of the top sub-array share a common set of high reference and low reference bit lines. The high reference and low reference bit lines from the top sub-array have switches (transistors 44 and 64, respectively) that rout or connect them to the common sensing rails in the bottom sub-array that are conductors 41 and 63. Similarly, the high reference and low reference bit lines from the bottom array have switches (transistors 46 and 66, respectively) that connect them to the common sensing rails in the top half which are conductors 37 and 51. Only one of either the top or the bottom memory sub-array is accessed for any particular read operation. Assume that an access is made to the top memory sub-array and to a particular column in its left sub-array. The control signal for one of transistors 34, 35 through 36 is made active in response to one of the control signals A, B through C as a result of a prior decode operation. Assume for exemplary purposes only that transistor 35 is made conductive. In response, data from the accessed column is placed onto the sensing rail, conductor 37. In addition, the control signal TRE to the high reference in the top left sub-array and to the low reference in the top right sub-array is made active. In response, the data from the high reference bit line and the low reference bit line is placed onto the sensing rails of conductor 41 and conductor 63, respectively. Since only one sub-array is active, either the top or the bottom sub-array, none of the other switches formed by transistors 38, 39 through 40 that share the same conductor 41 is conductive. Also, none of the switches formed by transistors 60, 61 through 62 that share the same conductor 63 is conductive. Given that the number of switches connected to conductors 37, 41, 51 and 63 is equal, there is balanced capacitance on the interconnect structure. In particular, the capacitive loading on the accessed bit line connected to conductor 37 resulting from the off-state switches (transistors 34, 36, etc.) on conductor 37 is completely balanced with the capacitive loading on the high reference bit line connected to conductor 41 and the low reference bit line connected to conductor 63. Thus the capacitive loading for any enabled reference bit line is provided by the nonconductive transistor switches of the inactive sub-array connected to the common sensing rail that the enabled reference bit line is on.

Multiplexing switch module 32 takes data from the four sensing rails (or conductors 37, 41, 51 and 63) and passes the data to the inputs of sense amplifier 24, while maintaining exact balance in the number of series transistors in each path and the number of transistor junctions connected to respective nodes in each path. Thus the data passed by transistor 35 is passed by transistor 82 to the Bit (B) input of sense amplifier 24 in response to signal TL (top left) of decode logic 30. The data is placed from conductor 37 to the BIT input of sense amplifier 24 via conductor 80. Similarly, the High Reference signal is passed by transistor 72 via conductor 70 to the High Reference (High) input of sense amplifier 24. Transistor 92 places the Low Reference input data from conductor 63 onto conductor 90 to the Low Reference (Low) input of sense amplifier 24. Switches 72, 82 and 92 are controlled by a common address decode output of Decode Logic 30. The three inputs of sense amplifier 24 and conductors 70, 80 and 90 have an equal number, four, of switch junctions on them and thus maintain capacitive balance with respect to each other. The loading from transistors 72, 74, 76 and 78 is balanced by the loading from transistors 82, 84, 86 and 88 and is also balanced by the loading from transistors 92, 94, 96 and 98. Since there is complete balance within the structure of the four sensing rails of column decode 20 and column decode 22, and complete balance within the structure of the multiplexing switch module 32, data from any bit line and its corresponding pair of references (high and low) can all three be transported to the sense amplifier 24 in a fully balanced manner.

Figure 3:
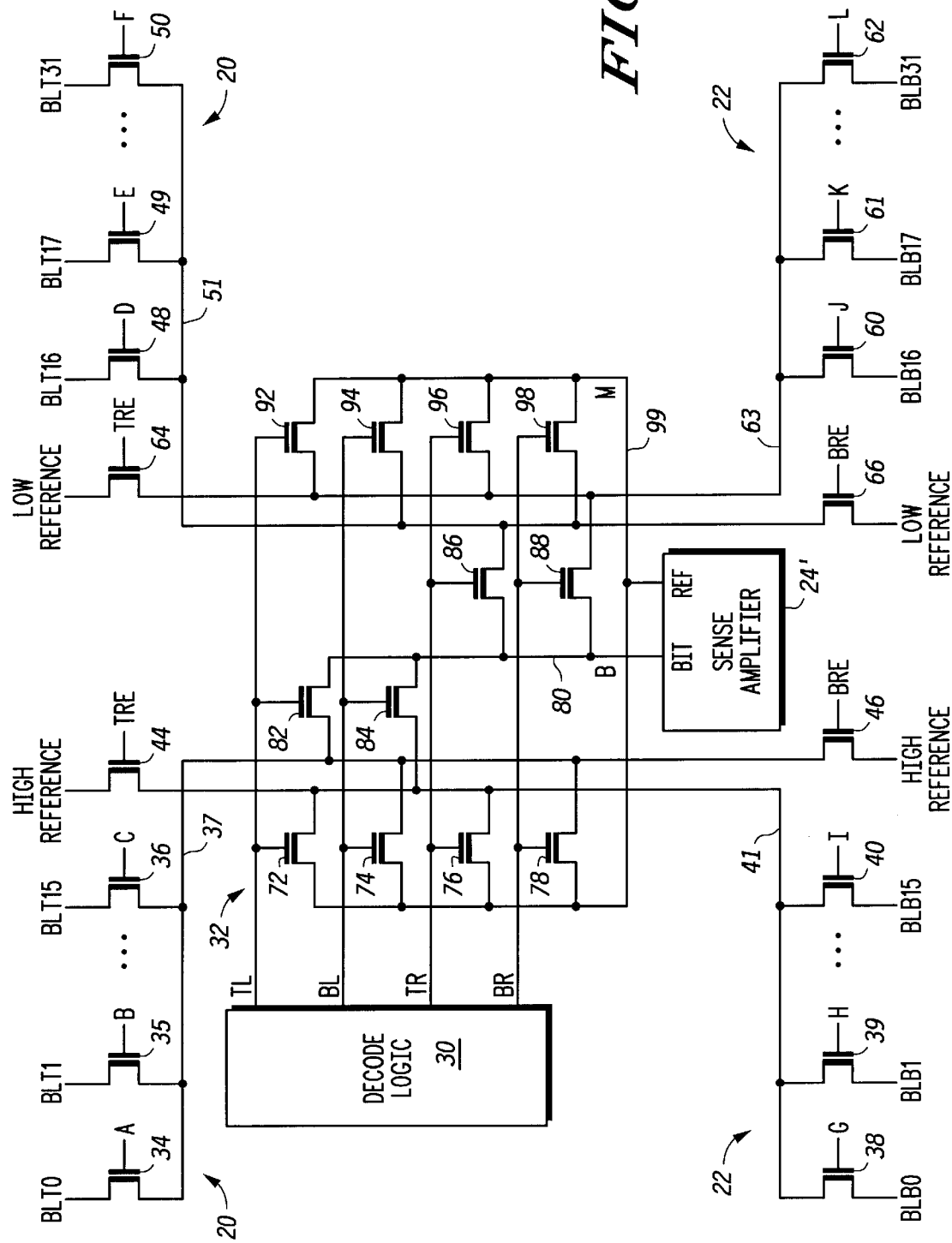
FIG. 3 illustrates in partial schematic form another form of a balanced load memory interconnect scheme.

Illustrated in FIG. 3 is an alternate implementation of the memory interconnect structure of FIG. 2. Instead of three sense amplifier inputs, High, Low and Bit, the sense amplifier 24' has only two inputs, Bit and a mid-level Reference (Ref). For purposes of explanation, common elements between FIG. 3 and FIG. 2 are given the same reference number. In contrast, the memory interconnect structure of FIG. 3 utilizes a common mid-level (M) reference conductor 99 in lieu of two separate reference conductors, the High reference conductor 70 and the Low reference conductor 90. All other aspects of the memory access operation are the same in connection with FIG. 3 as was explained for FIG. 2. It should be noted that in this implementation the loading on the Bit input of sense amplifier 24' is half the loading of its Reference input. The loading on the bit (B) input is composed of capacitive loading from switches 82, 84, 86 and 88 whereas the loading on reference input M is composed of capacitive loading from switches 72, 74, 76 and 78 as well as switches 92, 94, 96 and 98. This capacitance ratio can be accommodated in the design of sense amplifier 24'. An example of an internal compensation technique for sense amplifier 24' is to apply twice the current bias on its reference (Ref) input as on its Bit input.

Figure 4:
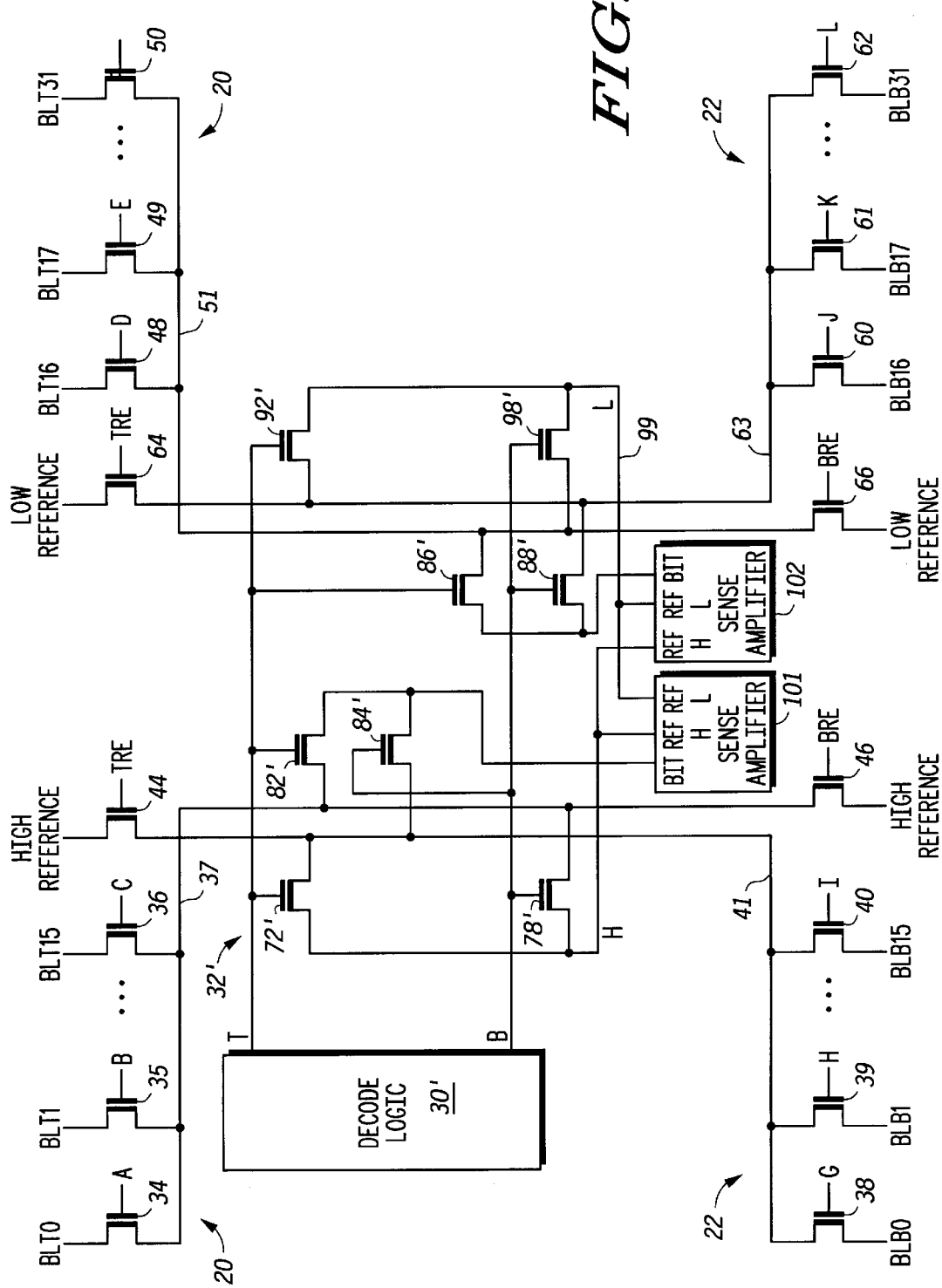
FIG. 4 illustrates in partial schematic form yet another form of a balanced load memory interconnect scheme.

Illustrated in FIG. 4 is another implementation of the memory interconnect structure of FIG. 2. For purposes of explanation, common elements between FIG. 4 and FIG. 2 are again given the same reference number and where similar elements have been slightly modified, a prime is used with the same number to denote some change in structure or operation. In FIG. 4, there are two sense amplifiers, a sense amplifier 101 and a sense amplifier 102. Each sense amplifier has three inputs: a Bit input, a low Reference input (Ref L) and a high Reference input (Ref H). Additionally, transistors 74, 76, 94 and 96 are removed from the structure of FIG. 2. Decode logic 30' provides only two decode signals, a top (T) array decode signal and a bottom (B) decode signal. Transistors 72', 82' and 92' are connected as they were in FIG. 2 with the exception that the gates thereof are connected to the top array decode signal. Also, the drain of transistor 72' is connected to each of the high Reference inputs of sense amplifiers 101, 102, and the drain of transistor 92' is connected to both low Reference inputs of sense amplifiers 101 and 102. Also, the drain of transistor 82' is connected to the Bit input of sense amplifier 101, and the drain of transistor 86' is connected to the Bit input of sense amplifier 102. Transistor 84' is connected as in FIG. 2 with the exception that its gate is connected to the bottom array decode signal and its source is connected to the Bit input of sense amplifier 101. The gate of transistor 86' is now connected to the top array decode signal and its drain is now connected to the Bit input of sense amplifier 102. Transistors 78', 88' and 98' are connected as they were in FIG. 2 with the exception that the gates thereof are connected to the bottom array decode signal, the drain of transistor 88' is connected to the Bit input of sense amplifier 102, and the drains of transistors 78' and 98' are now connected to both Reference inputs of the sense amplifiers 101 and 102. It should be further noted that if a two-input sense amplifier instantiation is desired, then the high Reference inputs are directly connected to the low Reference inputs illustrated in FIG. 4 and a single Reference input sense amplifier is implemented.

In operation, data accessed from the left sub-array (top or bottom) is connected to sense amplifier 101, and data accessed from the right sub-array (top or bottom) is connected to sense amplifier 102 at the same time. Only the top array or the bottom array is made active by an active word line (not shown) during a read access. Data accessed from both left and right sub-arrays is sensed simultaneously by sense amplifiers 101 and 102, respectively. The modifications of FIG. 4 provide a balanced interconnect structure for connecting data and mid-level reference values to the sense amplifiers 101 and 102. The logic of decode logic 30' and the number of output signals are halved as compared with the interconnect structure of FIG. 3. The decode logic 30' is simplified because decode logic 30' only needs to distinguish between top and bottom array read accesses as opposed to additionally distinguishing between left versus right sub-array read accesses.

Figure 5:
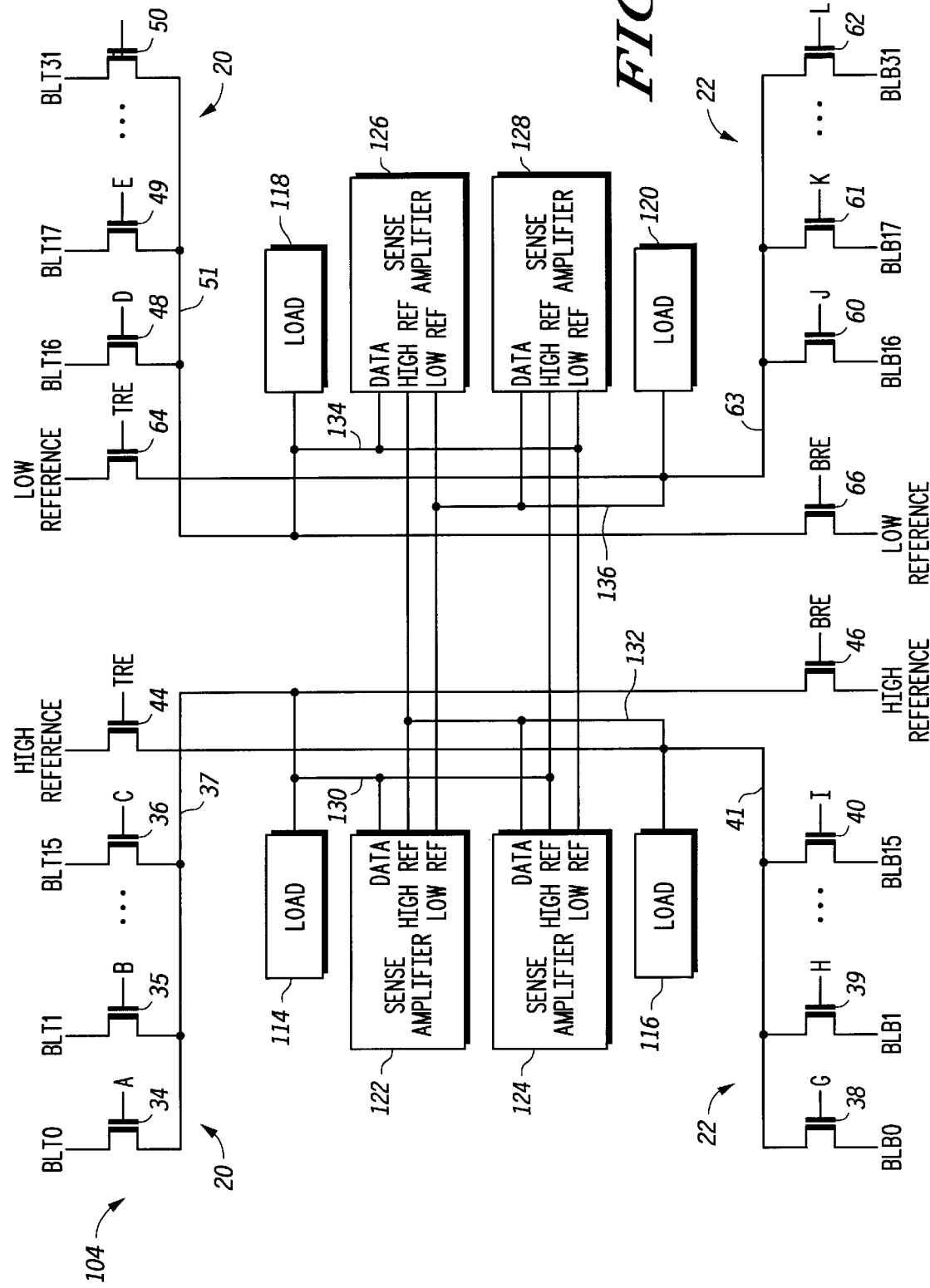
FIG. 5 illustrates in partial schematic form another memory interconnect structure that uses a balanced interconnect scheme in accordance with the present invention having a load device in lieu of multiplexing switches and associated decode logic.

Illustrated in FIG. 5 is an interconnect structure 104 for balanced data transfer that uses more sense amplifiers than the previously described implementations but which avoids using the multiplexing switch module 32 or 32'. Any elements of FIG. 5 that are the same as elements previously described in FIGS. 2, 3 and 4 are similarly numbered. Conductor 37 of prior FIGS. conducts either bit Data from the top left sub-array or Reference data from the bottom sub-array and is connected to a load device 114 that has an output connected to distribution conductor 130. A Data input of a sense amplifier 122 is connected to distribution conductor 130. A high reference (High Ref) input of a sense amplifier 124 and a high reference input of a sense amplifier 128 are each connected to the distribution conductor 130 for receiving an input from a high reference memory cell. Conductor 41 of prior FIGS. conducts either bit data from the bottom left sub-array or reference data from the top sub-array and is connected to a load device 116 that has an output connected to distribution conductor 132. A data input of sense amplifier 124 is connected to distribution conductor 132. Each of sense amplifiers 126 and 122 has a high reference input connected to distribution conductor 132. Conductor 51 of prior FIGS. conducts either bit data from the top right sub-array or reference data from the bottom sub-array and is connected to load device 118 that has an output connected to distribution conductor 134. A data input of sense amplifier 126 is connected to distribution conductor 134. A low reference (Low Ref) input of sense amplifier 128 is connected to distribution conductor 134, and a low reference (Low Ref) input of sense amplifier 124 is connected to distribution conductor 134 for receiving an input from a low reference memory cell. Conductor 63 of prior FIGS. conducts either bit data from the bottom right sub-array or Low reference data from the top sub-array and is connected to a load device that has an output connected to distribution conductor 136. A low reference (Low Ref) input of each of sense amplifiers 122 and 126 is connected to a distribution conductor 136.

In operation, either the top sub-array or the bottom sub-array is accessed during a read operation. Therefore, data from both left and right portions of a sub-array is transported to sense amplifiers 122, 126 or sense amplifiers 124, 128, respectively. Since conductor 37 contains bit data from the top left sub-array or reference high data from the bottom sub-array, its connection to distribution conductor 130 transports the data to three locations. The data is transported to the bit data input of sense amplifier 122, to the high reference input of sense amplifier 124 and to the high reference input of sense amplifier 128. Similarly, data on conductors 41, 63 and 51 is transported via distribution conductors 132, 136, and 134, respectively, to appropriate inputs to the sense amplifiers 122, 124, 126 and 128. In the case of current based data, the load devices 114, 116, 118 and 120 that are connected to distribution conductors 130, 132, 134 and 136, respectively, convert the current signal into a voltage signal for transporting to the appropriate sense amplifiers. For example, the load device could be a resistor, a diode-connected transistor or a transistor biased as a constant current source.

Figure 6:
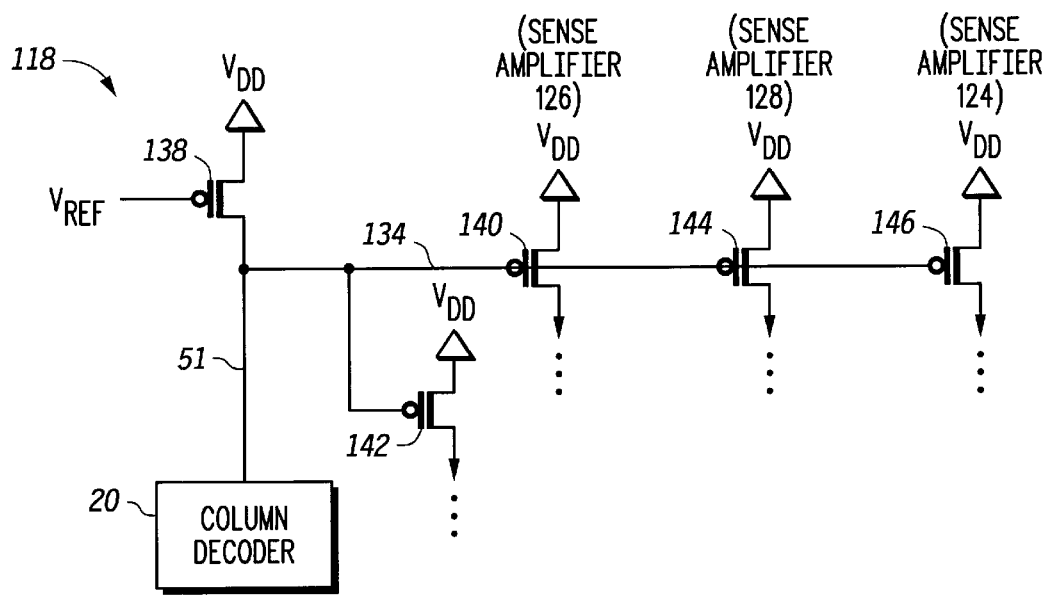
FIG. 6 illustrates in schematic form an exemplary implementation of one of the loads of FIG. 5.

An example of an implementation of one of the load devices of FIG. 5, load device 118, is illustrated in FIG. 6. The same elements that are common between FIG. 6 and prior figures are given the same reference number. A P-channel transistor 138 has a source connected to a power supply terminal labeled $V_{DD}$, a gate connected to a terminal for receiving a voltage reference, $V_{REF}$, and a drain connected to conductor 51 and distribution conductor 134. Column decoder 20 is connected to conductor 51. A P-channel transistor 140 has a gate connected to distribution conductor 134, a source connected to the $V_{DD}$ power supply terminal, and a drain connected to other circuitry within sense amplifier 126. Sense amplifier 126 has a second input provided by connecting a gate of a P-channel transistor 142 to distribution conductor 134. A source of transistor 142 is connected to the $V_{DD}$ power supply terminal, and a drain of transistor 142 is connected to other circuitry within sense amplifier 126. A gate of a P-channel transistor 144 is connected to the distribution conductor 134. A source of transistor 144 is connected to the $V_{DD}$ power supply terminal, and a drain of transistor 144 is connected to other circuitry within sense amplifier 128. A gate of a P-channel transistor 146 is connected to the distribution conductor 134. A source of transistor 146 is connected to the $V_{DD}$ power supply terminal and a drain thereof is connected to other circuitry within sense amplifier 124.

In operation, P-channel transistor 138 is biased by a reference voltage to be conductive. Transistor 138 functions as a constant current source to source current to a selected bit in the array through conductor 51 and column decoder 20. It should be appreciated that in an alternate form the gate of transistor 138 may be diode-connected so that its gate and drain are connected together at conductor 134. In such form, transistors 140, 142, 144 and 146 function as current mirrors with transistor 138. The voltage signal generated by the memory state of the bit or reference is transported via conductor 134 to each of the P-channel transistors in sense amplifiers 126, 128 and 124 to perform the sensing operation. If additional inputs are desired for a sense amplifier structure, one or more inputs can be provided by connecting an additional transistor such as transistor 142 to the input at conductor 134. In the illustrated form, sense amplifier 126 has two inputs formed by transistors 140 and 142. When two inputs are provided to a sense amplifier, a comparison of the state of the bit input and the state of a mid-level reference input is made to determine if the bit is higher or lower than the mid-level. The result determines whether the bit is considered to be a logic high value or a logic low value. When three inputs are provided to a sense amplifier, the sense amplifier averages the signal from the high and low reference inputs and compares the average value against the data bit value to determine whether the data bit is in a high or a low state. When four inputs are provided to a sense amplifier, two of the inputs would be the same bit data value and the other two inputs are a high reference and a low reference. The sense amplifier compares the difference between the high reference and a first of the bit data values against the difference between the low reference and a second of the bit data values to determine whether the data bit is in a high or a low state. Also, if interconnect capacitance balancing compensation is required within a sense amplifier as described previously in connection with FIG. 3, then additional transistors such as transistor 142 may similarly be provided.

Returning to FIG. 5, due to the symmetric nature of the connections, all data and reference lines and inputs to the sense amplifiers are balanced with respect to loading capacitance. The use of four sense amplifiers, one for each sub-array, eliminates the need for a multiplexing switch module while maintaining symmetry. The elimination of a multiplexing switch module connects the bit lines through the column decode switches directly to the sense amplifier without introducing additional transistors and their associated voltage drops in the path.

Figure 7:
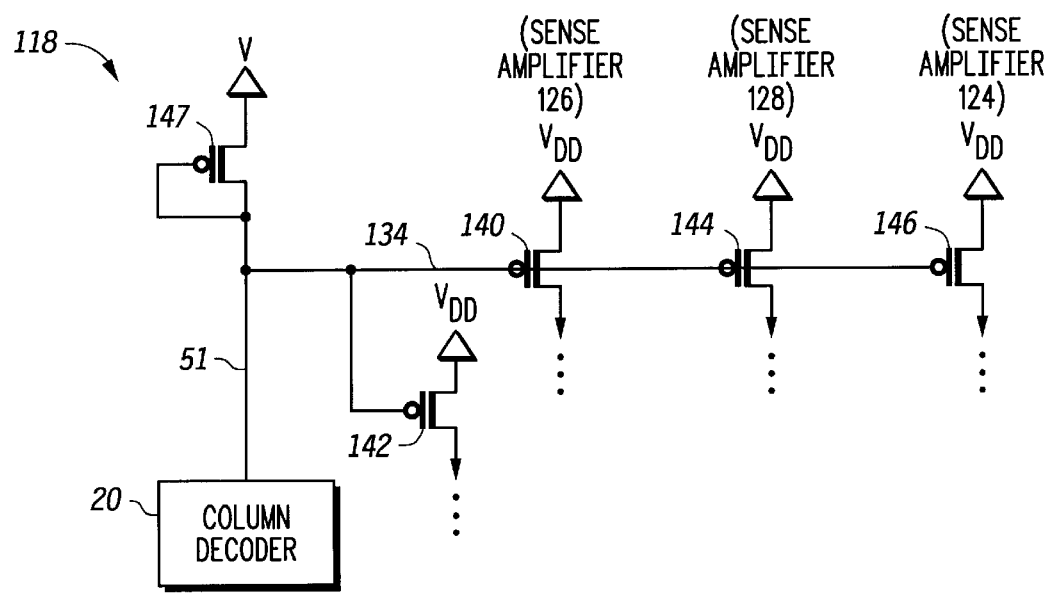
FIG. 7 illustrates in schematic form another exemplary implementation of a common source implementation of one of the loads of FIG. 5.

Illustrated in FIG. 7 is a schematic diagram of an alternate embodiment of a schematic that may be used as an implementation for any of the loads of FIG. 5, such as load 118. The loads are used to provide a high reference output, a low reference output and a bit output. For convenience of illustration, elements that are the same as those of the load embodiment illustrated in FIG. 6 are numbered identically as the structural connections will not be repeated. The FIG. 7 implementation of load 118 differs from the FIG. 6 implementation of load 118 in that a P-channel transistor 147 has a source connected to a voltage, V. The voltage V can be supply voltage $V_{DD}$ or could be some voltage less than $V_{DD}$. A gate of transistor 147 is connected to a drain thereof and is connected to node 134. All other structural connections of load 118 of FIG. 7 are the same as for load 118 of FIG. 6.

In operation, voltage V is applied to the source of transistor 147 and a voltage results across conductor 51. The properties of transistor 147 and the bit to be measured define the voltage across conductor 51. A higher resistance on the input (not shown in FIG. 7 but coupled through column decoder 20) will have a higher voltage across conductor 51, and a lower resistance will result in a lower voltage. Voltage V is regulated to limit the voltages on conductor 51 to be within a predetermined range.

Figure 8:
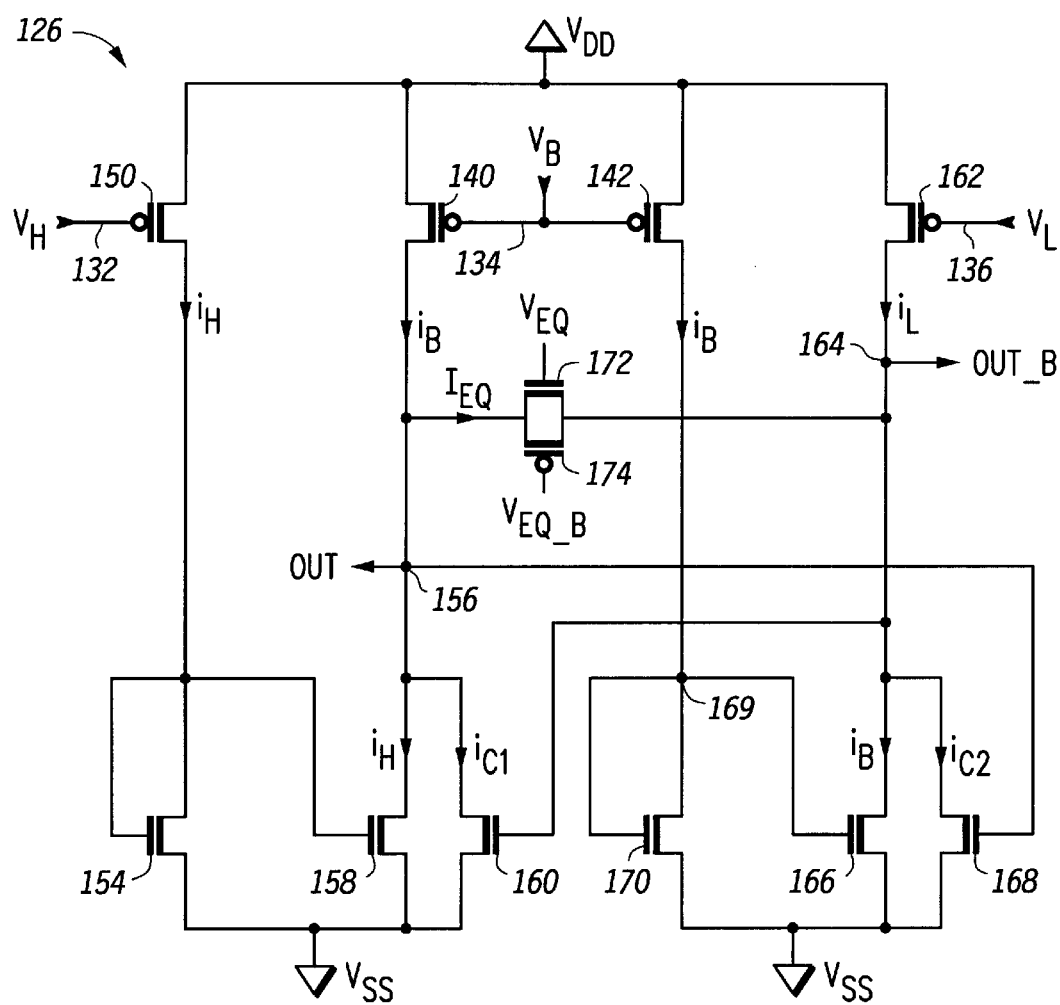
FIG. 8 illustrates in schematic form a sense amplifier for use with the voltage generated by the interconnect scheme of FIG. 5 and the load schematic of FIG. 7.

Illustrated in FIG. 8 is schematic diagram of a sense amplifier 126. Sense amplifier 126 has a P-channel transistor 140 having a first current electrode or a source connected to a first power supply terminal or a $V_{DD}$ supply voltage terminal, a control electrode or a gate connected to a first input terminal for receiving a bit voltage to be sensed, $V_B$, and a second current electrode or a drain that conducts a current $i_B$. The drain of transistor 140 is connected to an output terminal at a node 156 that provides a first output terminal, OUT. A P-channel transistor 142 has a source connected to the $V_{DD}$ supply voltage terminal, a gate connected to the input terminal for receiving the bit voltage to be sensed, $V_B$, and a drain that also conducts current $i_B$. The drain of transistor 142 is connected to node 169. A P-channel transistor 150 has a source connected to the $V_{DD}$ supply voltage terminal, a gate connected to a second input terminal for receiving a high reference voltage, $V_H$, and a drain connected to a drain of an N-channel transistor 154. Transistor 150 conducts a current $i_H$. A gate of transistor 154 is connected to the drain thereof. A source of transistor 154 is connected to a second power supply terminal or a $V_{SS}$ supply voltage terminal. An N-channel transistor 158 has a drain connected to node 156, a gate connected to the drain of transistor 154 and a source connected to the $V_{SS}$ supply voltage terminal. An N-channel transistor 160 has a drain connected to node 156, a gate connected to a node 164 that provides a second output terminal, OUT_B, and a source connected to the $V_{SS}$ supply voltage terminal. An N-channel transistor 170 has a drain connected to a gate thereof and to node 169, and has a source connected to the $V_{SS}$ supply voltage terminal. An N-channel transistor 166 has a drain connected to the second output terminal at node 164, a gate connected to node 169 and a source connected to the $V_{SS}$ supply voltage terminal. An N-channel transistor 168 has a drain connected to the second output terminal at node 164, a gate connected to the first output terminal at node 156 and a source connected to the $V_{SS}$ supply voltage terminal. A P-channel transistor 162 has a source connected to the $V_{DD}$ supply voltage terminal, a gate for providing an input for receiving a low reference voltage $V_L$, and a drain connected to the second output terminal at node 164. Transistor 162 conducts a current $i_L$. An N-channel equalization transistor 172 has a source connected to the first output terminal at node 156, a drain connected to the second output terminal at node 164, and a gate connected to an equalization control voltage, $V_{EQ}$. A P-channel equalization transistor 174 has a source connected to the first output terminal at node 156, a drain connected to the second output terminal at node 164, and a gate connected to an equalization control voltage, $V_{EQ\_B}$.

In operation, assume initially that signal $V_{EQ}$ and $V_{EQ\_B}$ are first made active to equalize the voltage potential between OUT and OUT$_{13}$B The purpose of the equalization feature is to maintain stability while the signals develop. During a sense operation, the voltage of the $V_H$ signal applied to the gate of transistor 150 creates an intermediate or a saturated current level, $i_H$, for transistor 150 that is proportional to $[(V_H-V_{DD})-V_t]^2$ where $V_t$ is the transistor threshold voltage of a P-channel transistor such as transistor 150. Similarly, the voltage of the $V_L$ signal applied to the gate of P-channel transistor 162 creates an intermediate or a saturated current level, $i_L$, for P-channel transistor 162 that is proportional to $[(V_L-V_{DD})-V_t]^2$ where $V_t$ is the transistor threshold voltage of a P-channel transistor such as transistor 162. Similarly, the voltage of the $V_B$ signal applied to the gates of transistors 140 and 142 creates another intermediate or saturated current level, $i_B$, for both transistors 140 and 142 that is proportional to $[(V_B-V_{DD})-V_t]^2$ where $V_t$ is a P-channel transistor threshold voltage such as for transistors 140 and 142. Thus, transistors 150, 154, 140 and 158 function as a first difference or subtraction circuit. Transistors 154 and 158 function as a first current mirror to implement the difference. Transistors 162, 166, 142 and 170 function as a second difference or subtraction circuit. In the illustrated form, the second difference circuit is implemented with transistors 170 and 166 functioning as a second current mirror. Current $i_H$ is mirrored through transistor 154 to create a saturated current level for transistor 158 equal to $i_H$. Similarly, current $i_B$ is mirrored through transistor 170 to create a saturated current level for transistor 166 that is equal to $i_B$. Assuming transistor 160 has a saturated current level of $i_{C1}$ and transistor 168 has a saturated current level of $i_{C2}$ and that transistors 160 and 168 are designed to match characteristics. Then the current through the equalization switches 172 and 174, $i_{EQ}$ is equal to $i_B-i_H-i_{C1}$ as calculated from the left side and equal to $i_B-i_L+i_{C2}$ as calculated from the right side. With the voltages at OUT and OUT_B equal because of the equalization switches, then $i_{C1}$ is equal to $i_{C2}$ because of the match of transistors 160 and 168. In this case, $i_{C1}$ equals $i_{C2}$ which again equals $(i_L-i_H)/2$. Thus $i_{EQ}$ equals $i_B-(i_L+i_H)/2$.

There are two cases to consider: the bit B of the memory cell being in the low resistance state so $i_B$ is approximately equal to $i_L$ and the bit B being in the high resistance state so $i_B$ is approximately equal to $i_H$. For the case where the bit B is in the low resistances state, $i_{EQ}$ equals $(i_L-i_H)/2$. When $V_{EQ}$ and $V_{EQ\_B}$ are made inactive, $i_{EQ}$ equals zero and the current $(i_L-i_H)/2$ causes the parasitic capacitance at node 156 to charge and to thus increase the voltage at OUT. Simultaneously, the current $-(i_L-i_H)/2$ causes the parasitic capacitance at node 164 to discharge and to thus decrease the voltage at OUT$_{13}$B. Transistors 160 and 168 provide a positive feedback to this voltage difference. Similarly, for the case where the bit B is in the high resistances state, $i_{EQ}$ equals $-(i_L-i_H)/2$. When $V_{EQ}$ and $V_{EQ\_B}$ are made inactive, $i_{EQ}$ equals zero and the current $-(i_L-i_H)/2$ causes the parasitic capacitance at node 156 to discharge and to thus decrease the voltage at OUT. Simultaneously, the current $(i_L-i_H)/2$ causes the parasitic capacitance at node 164 to charge and to thus increase the voltage at OUT$_{13}$B. Transistors 160 and 168 again provide a positive feedback to this voltage difference.

For both cases, the parasitic capacitance at nodes OUT and OUT$_{13}$B are both moving in opposite directions, each driven initially with a current equal in magnitude to $(i_L-i_H)/2$. This has significant speed advantages over most other sense amplifiers in which only one of the two outputs are driven by a current equal in magnitude to $(i_L-i_H)/2$.

By now it should be appreciated that there has been provided a sense amplifier having three inputs and the sense amplifier determines the state of a bit cell by converting a bit input voltage, a high reference voltage, and a low reference voltage to respective current values and taking the difference between: (1) a bit current and a high reference current; and (2) a low reference current and a bit current. Current mirrors used in conjunction with current steering circuitry form the difference of the bit current and the high reference current and also form the difference of the low reference current and the bit current. Additionally, the sense amplifier functions by using transistors 160 and 168 to drive differential outputs to reflect the difference between the two current differential quantities.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific embodiments. However, one of ordinary skill in the art appreciates that various modifications and changes can be made without departing from the scope of the present invention as set forth in the claims below. For example, the circuit implementation of the sense amplifier that is used with the memory interconnect structure taught herein may be varied and function in various methods to perform data sensing. Although MOSFETs of specific conductivity type are illustrated, it should be well understood that changes in the conductivity type or changes in the type of transistors may be made to implement the interconnect structures. The circuit structure of the multiplexing switch module 32 may be varied in numerous ways while still maintaining capacitive loading balance. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

What is claimed is:

1. A sense amplifier for detecting a state of a memory cell, comprising:

a first load for being coupled to a high reference memory cell and for providing a high reference output;

a second load for being coupled to a low reference memory cell and for providing a low reference output;

a third load for being coupled to the memory cell and for providing a bit output;

first difference means for receiving the high reference output and the bit output and providing a first difference output the first difference means comprising:
  a first transistor having a control electrode for receiving the high reference output, a first current electrode coupled to a first power supply terminal, and a second current electrode;
  a second transistor having a first current electrode coupled to the second current electrode of the first transistor, a control electrode coupled to the first current electrode of the second transistor, and a second current electrode coupled to a second power supply terminal;
  a third transistor having a first current electrode coupled to the second power supply terminal, a control electrode coupled to the first current electrode of the second transistor, and a second current electrode providing the first difference output; and
  a fourth transistor having a first current electrode coupled to the first power supply terminal, a control electrode for receiving the bit output, and a second current electrode coupled to the second current electrode of the third transistor;
second difference means for receiving the low reference output and the bit output and providing a second difference output the second difference means comprising:
  a fifth transistor having a control electrode for receiving the bit output, a first current electrode coupled to a first power supply terminal, and a second current electrode;
  a sixth transistor having a first current electrode coupled to the second current electrode of the fifth transistor, a control electrode coupled to the first current electrode of the sixth transistor, and a second current electrode coupled to a second power supply terminal;
  a seventh transistor having a first current electrode coupled to the second power supply terminal, a control electrode coupled to the first current electrode of the sixth transistor, and a second current electrode providing the second difference output; and
  an eighth transistor having a first current electrode coupled to the first power supply terminal, a control electrode for receiving the low reference output, and a second current electrode coupled to the second current electrode of the seventh transistor; and
third difference means for comparing the first difference output and the second difference output, the third difference means comprising:
  a ninth transistor having a first current electrode coupled to the second power supply terminal, a control electrode coupled to the second current electrode of the seventh transistor, and a second current electrode coupled to the second current electrode of the third transistor; and
  a tenth transistor having a first current electrode coupled to the second power supply terminal, a control electrode coupled to the second current electrode of the third transistor, and a second current electrode coupled to the second current electrode of the seventh transistor.

2. The sense amplifier of claim 1, wherein the third difference means further comprises an eleventh transistor having a first current electrode coupled to the second current electrode of the third transistor, a control electrode for receiving a first equalization signal, and a second current electrode coupled to the second current electrode of the seventh transistor.

3. The sense amplifier of claim 2 wherein the third difference means further comprises a twelfth transistor having a first current electrode coupled to the second current electrode of the third transistor, a control electrode for receiving a second equalization signal, and a second current electrode coupled to the second current electrode of the seventh transistor.

4. The sense amplifier of claim 1, wherein the first transistor, the fourth transistor, the fifth transistor and the eighth transistor comprise P-channel transistors characterized by a P-channel transistor threshold voltage, wherein the first difference means is for generating a first intermediate current that is proportional to a voltage of the high reference output minus a supply voltage present at a power supply terminal minus the P-channel transistor threshold voltage, quantity squared.

5. The sense amplifier of claim 4, wherein the second difference means is for generating a second intermediate current that is proportional to a voltage of the low reference output minus a supply voltage present at the power supply terminal minus the P-channel transistor threshold voltage, quantity squared.

6. The sense amplifier of claim 5, wherein the first difference means is for generating a third intermediate current that is proportional to a voltage of the bit output minus a supply voltage present at the power supply terminal minus the P-channel transistor threshold voltage, quantity squared.

7. The sense amplifier of claim 6, wherein the second difference means is for generating a fourth intermediate current that is proportional to a voltage of the bit output minus a supply voltage present at the power supply terminal minus the P-channel transistor threshold voltage, quantity squared.

8. A sense amplifier for detecting a state of a memory cell, comprising:
  a first load for being coupled to a high reference memory cell and for providing a high reference output;
  a second load for being coupled to a low reference memory cell and for providing a low reference output;
  a third load for being coupled to the memory cell and for providing a bit output;
  first difference means for receiving the high reference output and the bit output and providing a first difference output;
  second difference means for receiving a the low reference output and the bit output and providing a second difference output; and
  third difference means for comparing the first difference output and the second difference output, the third difference means comprising a first transistor for modifying current in the first difference means in response to the second difference output and a second transistor for modifying current in the second difference means in response to the first difference output.

9. The sense amplifier of claim 8, wherein the first difference means comprises a plurality of P-channel transistors characterized by a P-channel transistor threshold voltage, wherein the first difference means is for generating a first intermediate current that is proportional to a voltage of the high reference output minus a supply voltage minus the P-channel transistor threshold voltage, quantity squared.

10. The sense amplifier of claim 9, wherein the second difference means is for generating a second intermediate current that is proportional to a voltage of the low reference output minus the supply voltage minus the P-channel transistor threshold voltage, quantity squared.

11. The sense amplifier of claim 10, wherein the first difference means is for generating a third intermediate current that is proportional to a voltage of the bit output minus the supply voltage minus the P-channel transistor threshold voltage, quantity squared.

12. The sense amplifier of claim 11, wherein the second difference means is for generating a fourth intermediate current that is proportional to a voltage of the bit output minus a the supply voltage minus the P-channel transistor threshold voltage, quantity squared.

13. A sense amplifier, having transistors characterized as having a threshold voltage, for detecting a state of a memory cell, comprising:

first difference means for receiving a high reference output and a bit output, providing a first difference output, generating a first intermediate current that is proportional to a voltage of the high reference output minus a supply voltage present at a first power supply terminal minus a P-channel transistor threshold voltage, quantity squared, and generating a second intermediate current that is proportional to a voltage of the bit output minus a supply voltage present at the first power supply terminal minus the P-channel transistor threshold voltage, quantity squared;

second difference means for receiving a low reference output and the bit output, providing a second difference output, generating a third intermediate current that is proportional to a voltage of the low reference output minus a supply voltage present at the first power supply terminal minus the P-channel transistor threshold voltage, quantity squared, and generating a fourth intermediate current that is proportional to a voltage of the bit output minus a supply voltage present at the first power supply terminal minus the P-channel transistor threshold voltage, quantity squared; and third difference means for comparing the first difference output and the second difference output, the third difference means comprising a first transistor for modifying current in the first difference means in response to the second difference output and a second transistor for modifying current in the second difference means in response to the first difference output.

\* \* \* \* \*